(12) United States Patent
Koo et al.

(10) Patent No.: US 10,043,421 B2
(45) Date of Patent: Aug. 7, 2018

(54) FOLDABLE DISPLAY DEVICE

(71) Applicant: SAMSUNG DISPLAY CO., LTD., Yongin-si, Gyeonggi-Do (KR)

(72) Inventors: Hyunwoo Koo, Hwaseong-si (KR); Taewoong Kim, Seongnam-si (KR); Kiyong Lee, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 228 days.

(21) Appl. No.: 15/001,465

(22) Filed: Jan. 20, 2016

(65) Prior Publication Data
US 2016/0212840 A1 Jul. 21, 2016

(30) Foreign Application Priority Data
Jan. 21, 2015 (KR) .................. 10-2015-0010224

(51) Int. Cl.
| | | |
|---|---|---|
| H05K 1/18 | (2006.01) |
| G09F 9/30 | (2006.01) |
| G06F 1/16 | (2006.01) |
| G09G 3/00 | (2006.01) |
| G09G 3/3208 | (2016.01) |

(52) U.S. Cl.
CPC ............ G09F 9/301 (2013.01); G06F 1/1615 (2013.01); G06F 1/1626 (2013.01); G06F 1/1641 (2013.01); G06F 1/1652 (2013.01); *G09G 3/00* (2013.01); *G09G 3/3208* (2013.01); *G09G 2380/02* (2013.01); *H05K 1/18* (2013.01)

(58) Field of Classification Search
None
See application file for complete search history.

(56) References Cited

U.S. PATENT DOCUMENTS

| | | | | |
|---|---|---|---|---|
| 9,173,287 | B1* | 10/2015 | Kim | H05K 1/028 |
| 9,179,559 | B1* | 11/2015 | Kim | G06F 1/1616 |
| 9,189,027 | B2* | 11/2015 | Lee | G06F 1/1641 |
| 2006/0132025 | A1 | 6/2006 | Gao et al. | |
| 2013/0010405 | A1* | 1/2013 | Rothkopf | H04M 1/0216 361/679.01 |
| 2013/0135729 | A1 | 5/2013 | Hirata et al. | |
| 2015/0382446 | A1* | 12/2015 | Kwon | H05K 1/028 174/251 |

FOREIGN PATENT DOCUMENTS

| | | |
|---|---|---|
| JP | 2010-266777 A | 11/2010 |
| JP | 2013-231982 A | 11/2013 |
| KR | 10-2013-0076402 A | 7/2013 |
| KR | 10-2013-0126710 A | 11/2013 |
| KR | 10-2014-0014669 A | 2/2014 |

* cited by examiner

*Primary Examiner* — Courtney Smith
*Assistant Examiner* — Jessey R Ervin
(74) *Attorney, Agent, or Firm* — Lee & Morse, P.C.

(57) ABSTRACT

A foldable display device includes a first display area, a second display area, and a first folding area between the first display area and the second display area. The first folding area includes first, second, and third folding axes. The first folding axis is between the second and third folding axes. The foldable display device is folded in one direction of the both directions on the basis of the first folding axis or folds in the other direction of the both directions on the basis of the second and third folding axes.

18 Claims, 27 Drawing Sheets

FOLDABLE DISPLAY DEVICE

CROSS-REFERENCE TO RELATED APPLICATION

Korean Patent Application No. 10-2015-0010224, filed on Jan. 21, 2015, and entitled, "Foldable Display Device," is incorporated by reference herein in its entirety.

BACKGROUND

1. Field

One or more embodiments described herein relate to a foldable display device.

2. Description of the Related Art

A flexible display module has been developed which bends, rolls, or folds. One type of flexible display module includes a flexible display panel, pixels, and various functional members on a base member.

SUMMARY

In accordance with one or more embodiments, a foldable display device which includes a first display area; a second display area; and a first folding area between the first display area and the second display area and including first, second, and third folding axes, wherein the first folding axis is between the second and third folding axes. The foldable display device could be folded in both directions. The foldable display device is to fold in one direction of the both directions on the basis of the first folding axis and is to fold in the other direction of the both directions on the basis of the second and third folding axes.

Each of the first display area, the second display area, and the first folding area may include a display surface, the display surface of the first display area and the display surface of the second display area may display an image when the foldable display device is outer folded, the display surface of the first display area and the display surface of the second display area may face outside the foldable display device when the foldable display device is outer folded.

The first folding area may be inner folded on the basis of the first folding axis to allow the display surface of the first display area to face the display surface of the second display area, or the first folding area is outer folded on the basis of the second and third folding axes may allow the display surface of the first display area and the display surface of the second display area to face outside.

The first folding area may be inner folded on the basis of the second and third folding axes to allow the display surface of the first display area to face the display surface of the second display area, or the first folding area may be outer folded on the basis of the first folding axis to allow the display surface of the first display area and the display surface of the second display area to face outside.

The foldable display device may include a third display area; and a second folding area between the second and third display areas and including fourth, fifth, and sixth folding axes, wherein the fourth folding axis is between the fifth and sixth folding axes, and the foldable display device is to fold in one direction of the both directions on the basis of the fourth folding axis and to fold in the other direction of the both directions on the basis of the fifth and sixth folding axes.

Each of the first display area, the second display area, the third display area, the first folding area, and the second folding area may include a display surface, and each of the display surface of the first display area, the display surface of the second display area, and the display surface of the third display area may display the image while exposed outside.

The first folding area may be inner folded on the basis of the first folding axis to allow the display surface of the first display area to face the display surface of the second display area, and the second folding area is inner folded on the basis of the fifth and sixth folding axes may allow the display surface of the third display area to face the display surface of the second display area.

The first folding area may be inner folded on the basis of the first folding axis to allow the display surface of the first display area to face the display surface of the second display area, and the second folding area is outer folded on the basis of the fourth folding axis may allow the display surface of the third display area to face outside. The second folding area exposed outside may display the image.

In accordance with one or more other embodiments, a foldable display device includes a first display area; a second display area; and a folding area between the first display area and the second display area and including first and second folding axes, wherein the foldable display device is to fold in one direction of the both directions on the basis of the first folding axis and to fold in the other direction of the both directions on the basis of the second folding axis.

In accordance with one or more other embodiments, a foldable display device includes a flexible display module; and a housing coupled to the flexible display module and including first, second, and third rotational axles, wherein the first rotational axle is between the second and third rotational axles, the flexible display module is to fold in one direction of the both directions on the basis of the first rotational axle, and the flexible display module is to fold in the other direction of the both directions on the basis of the second and third rotational axles.

The housing may include a first body part; a second body part; a third body part hinge-coupled to the first body part; and a fourth body part hinge-coupled to the second and third body parts, wherein a portion at which the first body part is hinge-coupled to the third body part corresponds to the second rotational axle, a portion at which the second body part is hinge-coupled to the fourth body part corresponds to the third rotational axle, and a portion at which the third body part is hinge-coupled to the fourth body part corresponds to the first rotational axle.

The flexible display module may include a first area corresponding to the first body part, a second area corresponding to the second body part, and a third area corresponding to the third and fourth body parts, and a display surface of the first area and a display surface of the second area to display an image when the flexible display module is outer folded to allow the display surface of the first area and the display surface of the second area to face an outside of the flexible display module.

The display surface of the first area and the display surface of the second area may be inner folded on the basis of the first rotational axle to face each other, and the display surface of the first area and the display surface of the second area may be outer folded on the basis of the second and third rotational axles to allow the display surface of the first area and the display surface of the second area to face outside.

The display surface of the first area and the display surface of the second area may be inner folded on the basis of the second and third rotational axles to face each other, and the display surface of the first area and the display surface of the second area are outer folded on the basis of the first rotational axle may allow the display surface of the first area and the display surface of the second area to face outside.

The flexible display module may include a flexible display panel; a first outer member on a front surface of the flexible display panel; and a second outer member on a rear surface of the flexible display panel. The first outer member may include a first portion including a first flat plane surface; and a second portion, protruding from the first flat plane surface and overlapping a rotational axle, may apply tensile stress to the first outer member when the flexible display module is folded.

The second outer member may include a third portion including a second flat plane surface; and a fourth portion protruding from the second flat plane surface and overlapping a rotational axle, to apply tensile stress to the second outer member when the flexible display module is folded. The second portion may include a second flat plane surface protruding from the first flat plane surface; and an inclination surface connecting the first flat plane surface and the second flat plane surface. The foldable display device may include a plurality of grooves in the second portion and substantially parallel to the first, second, and third rotational axes.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
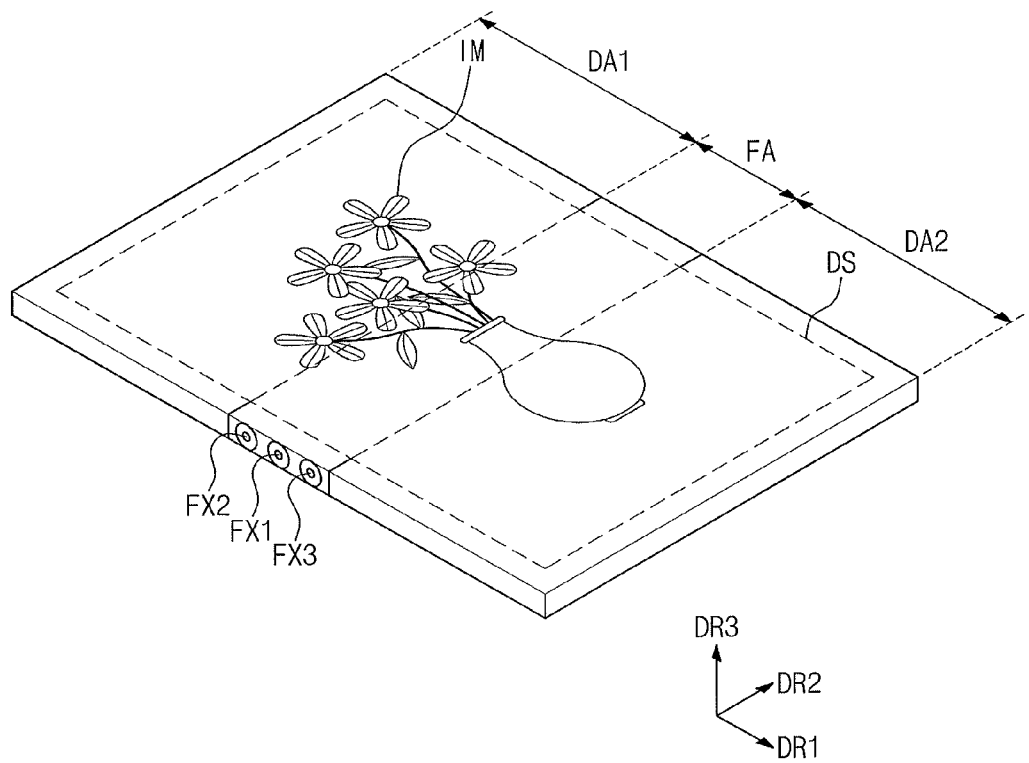
FIG. 1A illustrates an embodiment of a foldable display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1B:
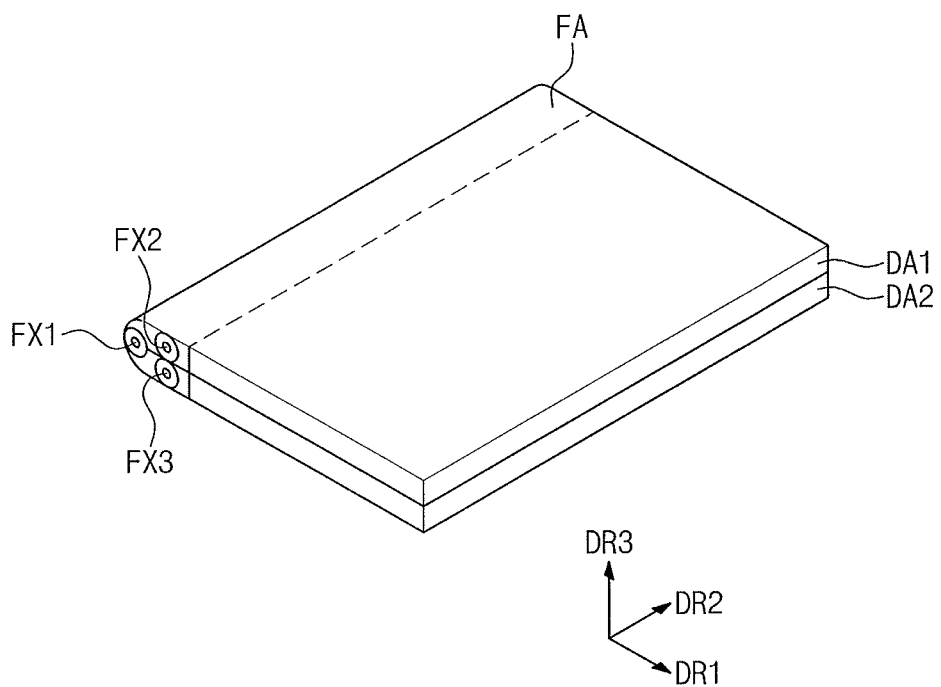
FIG. 1B illustrates the foldable display device in a first folded state.
Figure 1C:
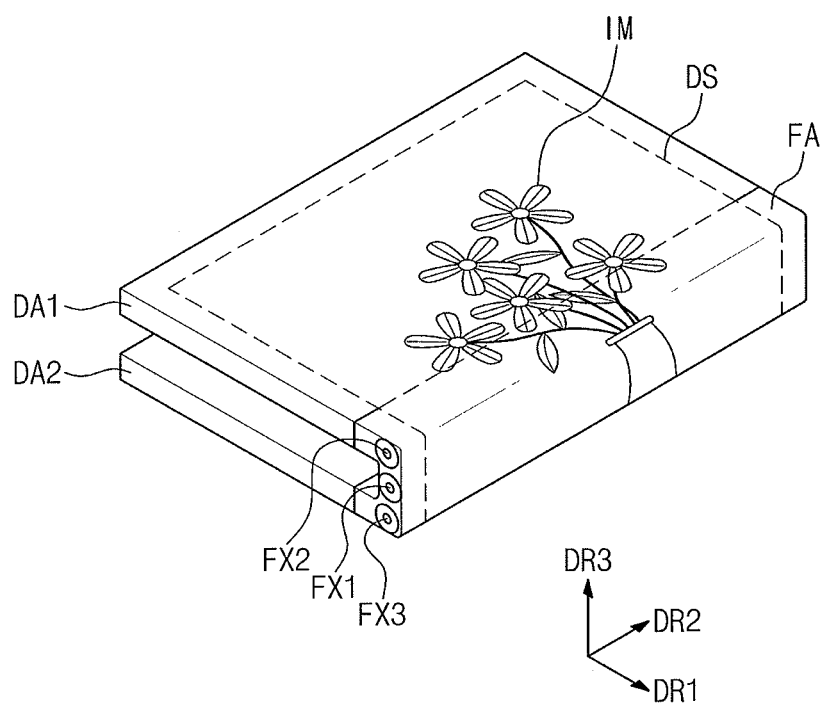
FIG. 1C illustrates the foldable display device in a second folded state.

FIGS. 1A-1C illustrate an embodiment of a foldable display device which includes a folding area FA between a first display area DA1 and a second display area DA2. The device also includes first, second, and third folding axes FX1, FX2, and FX3 in the folding area FA. In another embodiment, the foldable display device may include two or more folding areas in the same or different directions.

The foldable display device also includes a display surface DS for displaying an image IM. The display surface DS includes a display surface of the first display area DA1, a display surface of the second display area DA2, and a display surface of the folding area FA. In the present exemplary embodiment, a first direction DR1 and a second direction DR2 define the display surface DS when the foldable display device is unfolded. A third direction DR3 indicates a thickness direction of the foldable display device and the second direction DR2 indicates a direction in which the first, second, and third folding axes FX1, FX2, and FX3 extend.

The first folding axis FX1 is between the second and third folding axes FX2 and FX3. The first folding axis FX1 allows the foldable display device to be folded in a direction or manner different from the second and third folding axes FX2 and FX3.

Referring to FIG. 1B, when the foldable display device is folded on the basis of the first folding axis FX1, the display surface of the first display area DA1 faces the display surface of the second display area DA2. (The folded state which allows the display surfaces of different areas to face each other is referred to as inner folding.) In this case, the foldable display device is not folded on the basis of the second and third folding axes FX2 and FX3.

When the first display area DA1 is rotated in a clockwise direction with respect to the first folding axis FX1, the foldable display device is inner folded. That is, the foldable display device is folded in one direction of the both directions on the basis of the first folding axis FX1. To inner fold the foldable display device so that the first display area DA1 is aligned with the second display area DA2, the first folding axis FX1 is defined at a center of the foldable display device on the basis of the first direction DR1.

As shown in FIG. 1C, the foldable display device may be folded with respect to the second and third folding axes FX2 and FX3, so that the display surfaces of the first and second display areas DA1 and DA2 are toward the outside of the foldable display device. (The folded state which allows the display surfaces of different areas to face outside of the foldable display device is referred to as an outer folding.)

When the second display area DA2 is rotated in a counter-clockwise direction with respect to the second and third folding axes FX2 and FX3, the foldable display device is outer folded. That is, the foldable display device is folded in the other direction of the both directions on the basis of the second folding axis FX2. To outer fold the foldable display device so that the first display area DA1 is aligned with the second display area DA2, the distance in the first direction DR1 between the first and second folding axes FX1 and FX2 may be substantially the same as the distance in the first direction DR1 between the first and third folding axes FX1 and FX3.

Referring to FIGS. 1A and 1C, when the display surface of the first display area DA1 and the display surface of the second display area DA2 are exposed to the outside, the image IM is displayed. In addition, the image IM may be displayed on the display surface of the folding area FA exposed to the outside. As shown in FIG. 1A, the image IM may be displayed when the foldable display device is in an unfolded state. As shown in FIG. 1C, the image IM may be displayed when the foldable display device is in the outer folding state. The first display area DA1, the second display area DA2, and the folding area FA may respectively display different images including independent information or may respectively display different portions of one image including the same information.

Referring to FIGS. 1A to 1C, the foldable display device may be folded in different directions on the basis of the first, second, and third folding axes FX1, FX2, and FX3 in the folding area FA. Since the inner folding and the outer folding are performed on the basis of different axes from each other, portions of the display surfaces, which correspond to the folding axes, receive a tensile stress or a compressive stress. As shown in FIG. 1B, the compressive stress is applied to the portions of the display surface corresponding to the first folding axis FX1 and the tensile stress is applied to the portions of the display surfaces corresponding to the second and third folding axes FX2 and FX3.

When the foldable display device is folded in different directions on the basis of one folding axis, the tensile stress and the compressive stress are alternately applied to the portion of the display surface corresponding to the folding axis. As a result, the portion of the foldable display device, in which the one folding axis is defined, may be deformed or defects may occur on the portion corresponding to the one folding axis. However, according to the present exemplary embodiment, the tensile stress and the compressive stress, which are generated when the foldable display device is folded in different directions, are distributed by the folding axes. Accordingly, defects of the foldable display device are reduced or eliminated.

Figure 2A:
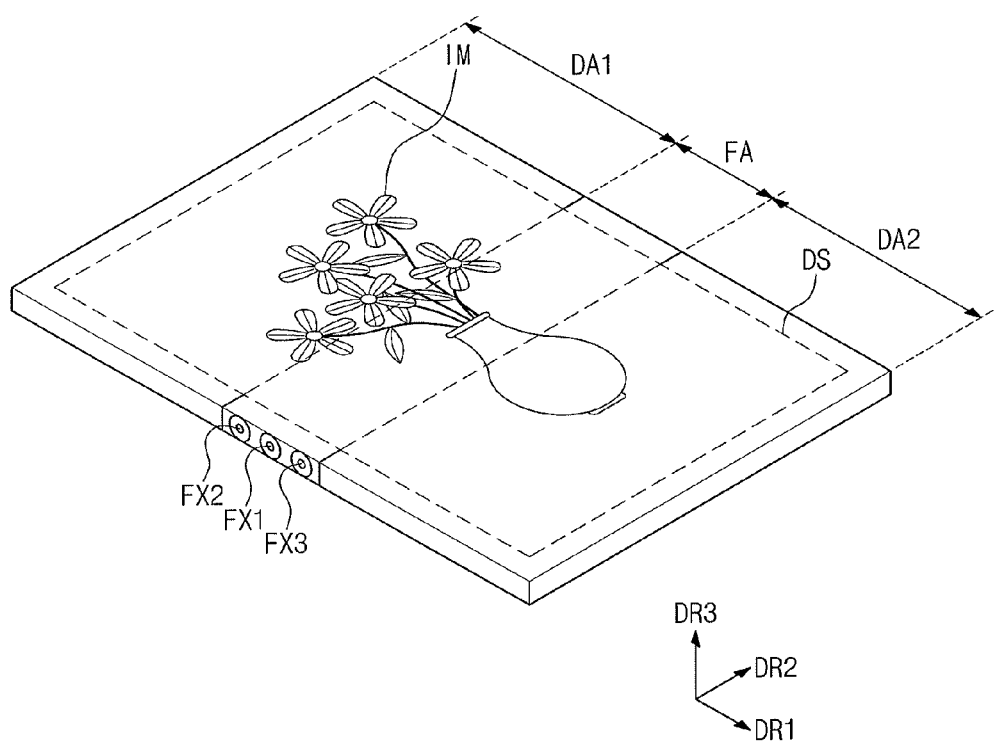
FIG. 2A illustrates another embodiment of a foldable display device.
Figure 2B:
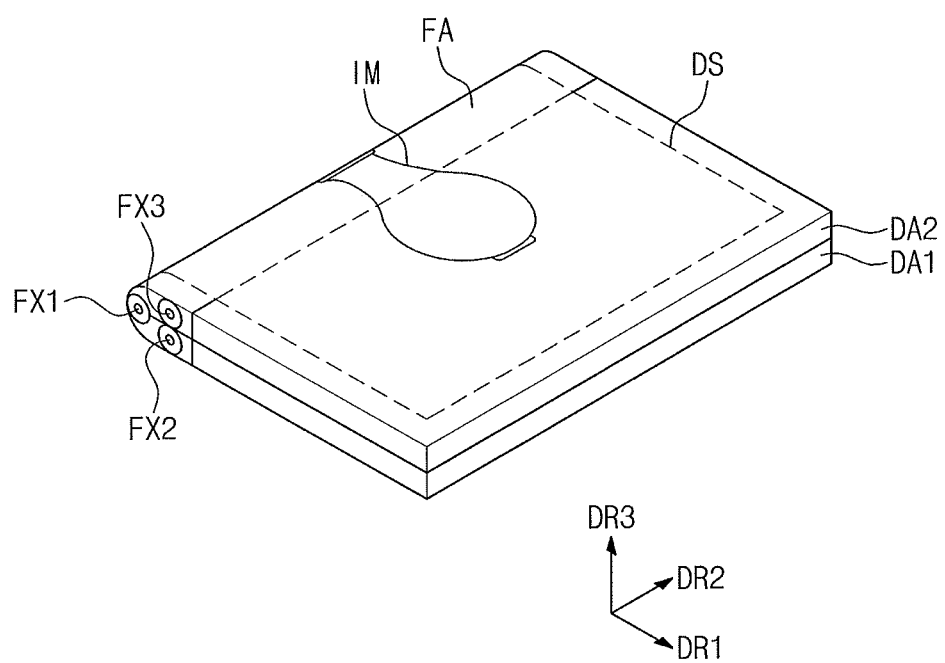
FIG. 2B illustrates the foldable display device in a first folded state.
Figure 2C:
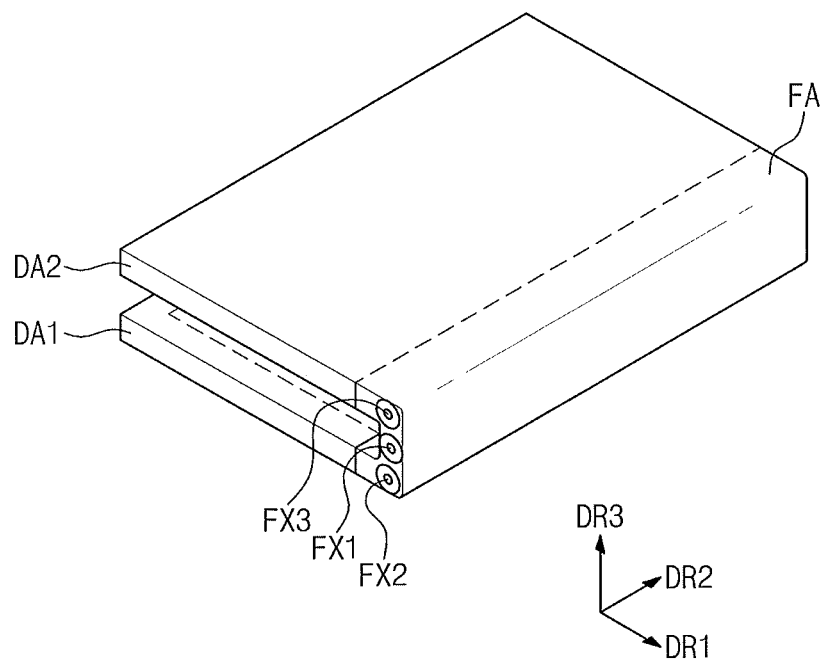
FIG. 2C illustrates the foldable display device in a second folded state.

FIGS. 2A to 2C illustrate an embodiment of a foldable display device that has folding axes different from those shown in FIGS. 1A to 1C. Referring to FIG. 2B, the foldable display device is outer folded on the basis of the first folding axis FX1 so that the display surfaces of the first and second display areas DA1 and DA2 are toward the outside of the foldable display device. In this case, the foldable display device is not folded on the basis of the second and third folding axes FX2 and FX3. Referring to FIG. 2C, the foldable display device is outer folded on the basis of the second and third folding axes FX2 and FX3 to allow the display surfaces of the first and second display areas DA1 and DA2 to face each other. In this case, the foldable display device is not folded on the basis of the first folding axis FX1.

Figure 3A:
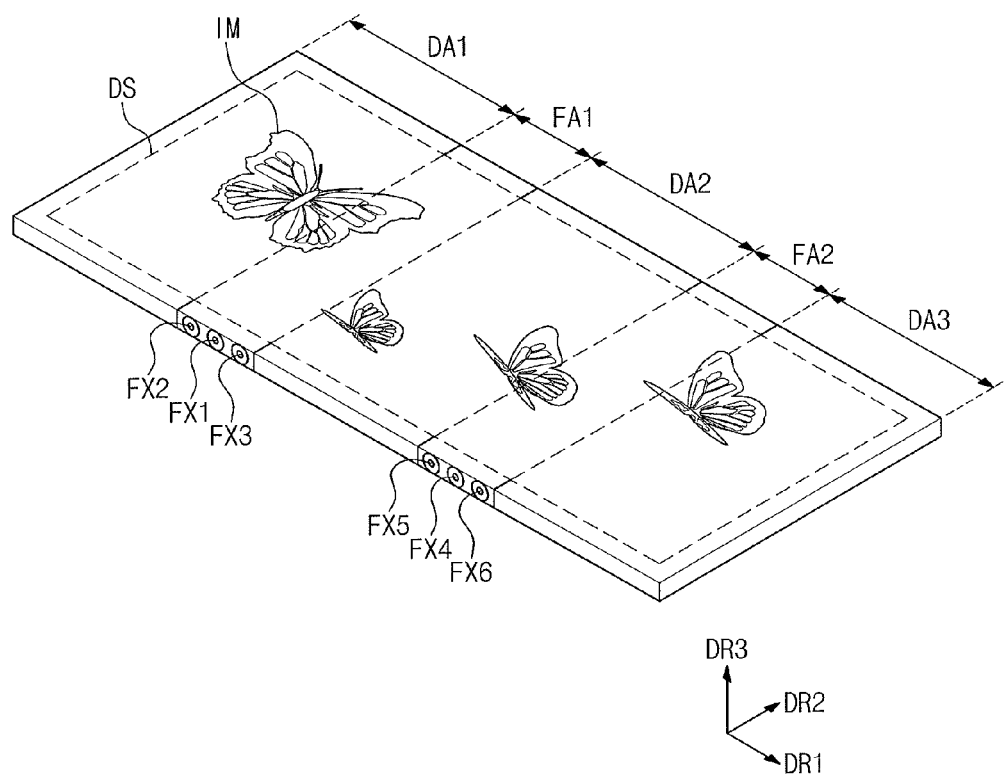
FIG. 3A illustrates another embodiment of a foldable display device.
Figure 3B:
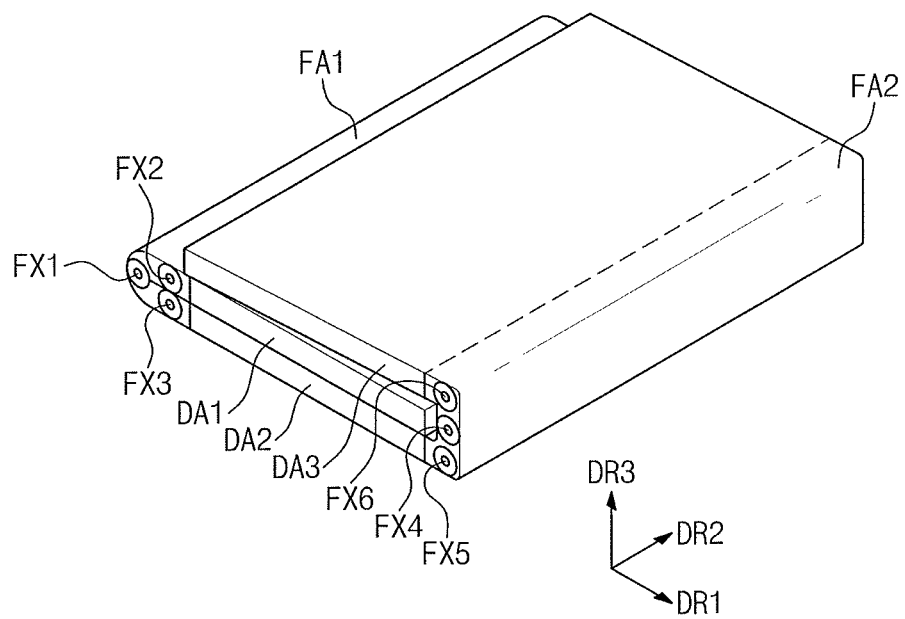
FIG. 3B illustrates the foldable display device in a first folded state.
Figure 3C:
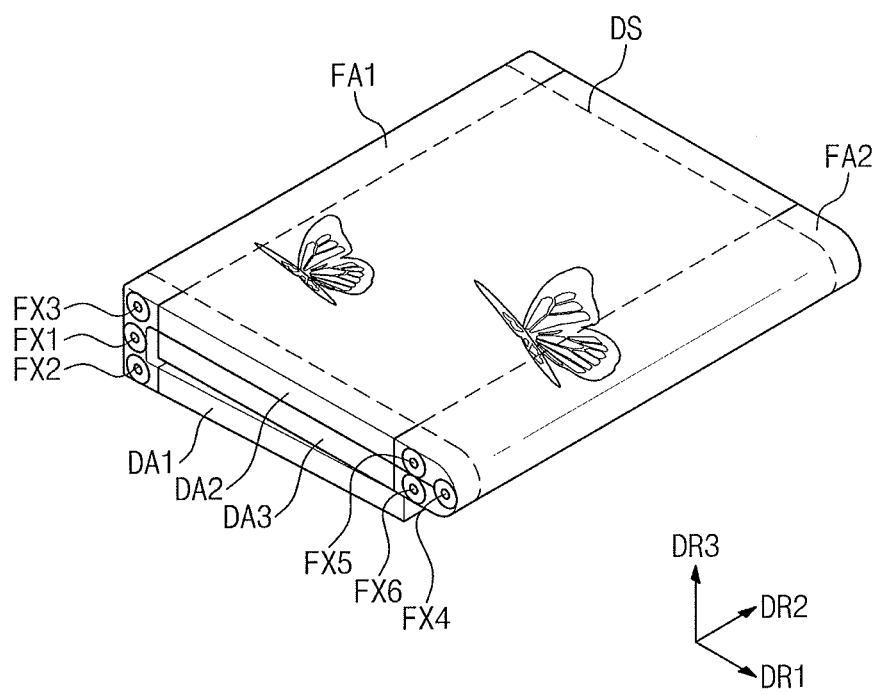
FIG. 3C illustrates the foldable display device in a second folded state.
Figure 4A:
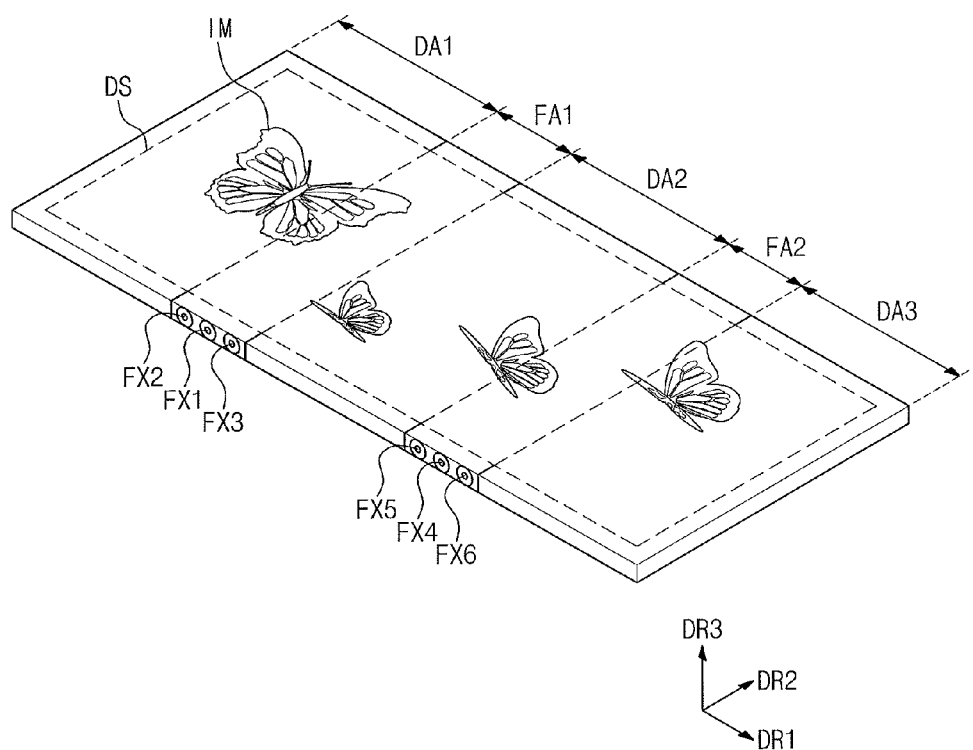
FIG. 4A illustrates another embodiment of a foldable display device.
Figure 4B:
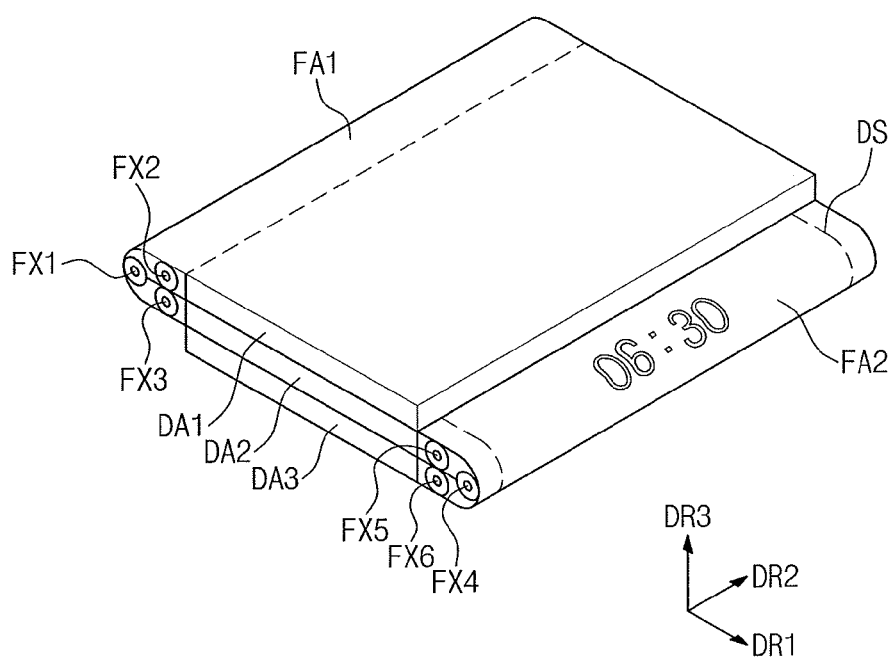
FIG. 4B illustrates the foldable display device in a first folded state.
Figure 4C:
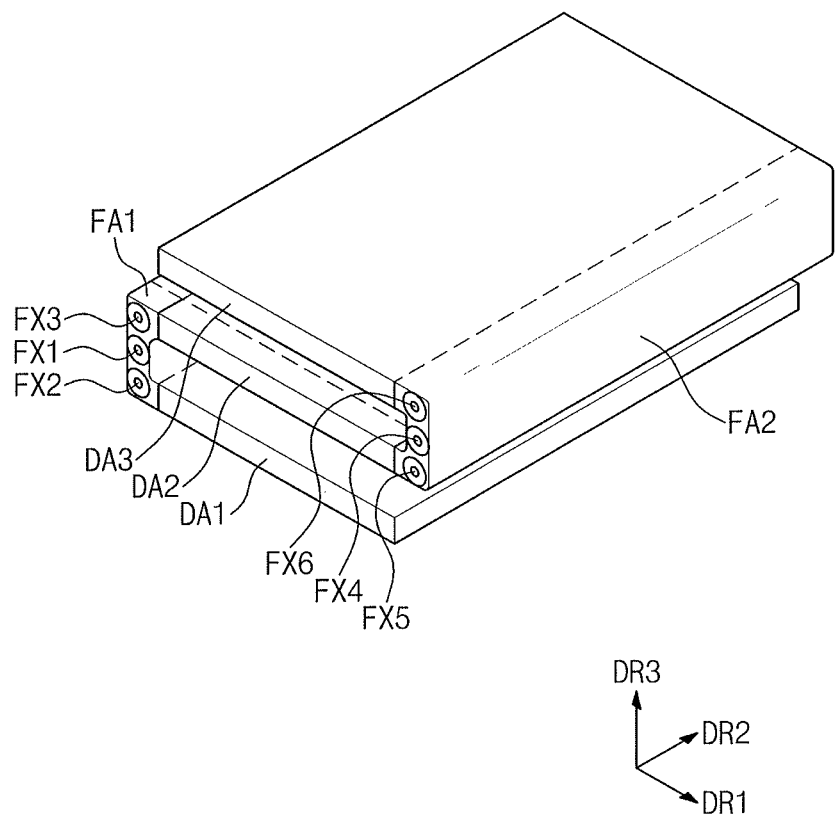
FIG. 4C illustrates the foldable display device in a second folded state.

FIG. 3A illustrates another embodiment of a foldable display device, FIG. 3B illustrates the foldable display device in a first folded state, and FIG. 3C illustrates the foldable display device in a second folded state. FIG. 4A illustrates another embodiment of a foldable display device, FIG. 4B illustrates the foldable display device in a first folded state, and FIG. 4C illustrates the foldable display device in a second folded state. In FIGS. 3A to 3C and 4A to 4C, the same reference numerals denote the same elements in FIGS. 1A to 1C and 2A to 2C.

Different from the foldable display device of FIGS. 1A-1C and 2A-2C, the foldable display device in FIGS. 3A-3C and 4A-4C includes a plurality of folding areas FA1 and FA2. Each of the folding areas FA1 and FA2 may be folded in different directions. FIGS. 3A-3C and 4A-4C show the foldable display device including two folding areas FA1 and FA2.

Referring to FIGS. 3A to 3C, the foldable display device includes first, second, and third display areas DA1, DA2, and DA3 and first and second folding areas FA1 and FA2. The first folding area FA1 is between the first and second display areas DA1 and DA2, and the second folding area FA2 is between the second and third display areas DA2 and DA3. Three folding axes are defined in each of the first and second folding areas FA1 and FA2.

Each of the first and second folding areas FA1 and FA2 may substantially the same as the folding area FA in FIGS. 1A to 1C or the folding area FA in FIGS. 2A to 2C. First, second, and third folding axes FX1, FX2, and FX3 are defined in the first folding area FA1, and fourth, fifth, and sixth folding axes FX4, FX5, and FX6 are defined in the second folding area FA2.

Referring to FIG. 3B, the first folding area FA1 is inner folded on the basis of the first folding axis FX1. The second folding area FA2 is inner folded on the basis of the fifth and sixth folding axes FX5 and FX6. Referring to FIG. 3C, the first folding area FA1 is outer folded on the basis of the second and third folding axes FX2 and FX3. In FIG. 3C, the first folding area FA1 may not be folded on the basis of the second folding axis FX2. The second folding area FA2 may be outer folded on the basis of the fourth folding axis FX4. As shown in FIGS. 3A and 3C, the image IM is displayed when the display surface of the first display area DA1, the display surface of the second display area DA2, and the display surface of the third display area DA3 are exposed to the outside of the flexible display device. In addition, the image IM may be displayed in the display surfaces of the first and second folding areas FA1 and FA2 exposed to the outside.

The foldable display device in FIGS. 4A to 4C includes the folding axes having different folding directions from those of the foldable display device in FIGS. 3A to 3C.

As shown in FIG. 4B, the first folding area FA1 is inner folded on the basis of the first folding axis FX1, and substantially simultaneously the first folding area FA1 is outer folded on the basis of the fourth folding axis FX4. As shown in FIG. 4C, the first folding area FA1 is outer folded on the basis of the second and third folding axes FX2 and FX3. The second folding area FA2 is inner folded on the basis of the fourth folding axis FX4. As shown in FIGS. 4A-4C, the image IM is displayed in portions of the display surfaces, which are exposed to the outside.

Figure 5A:
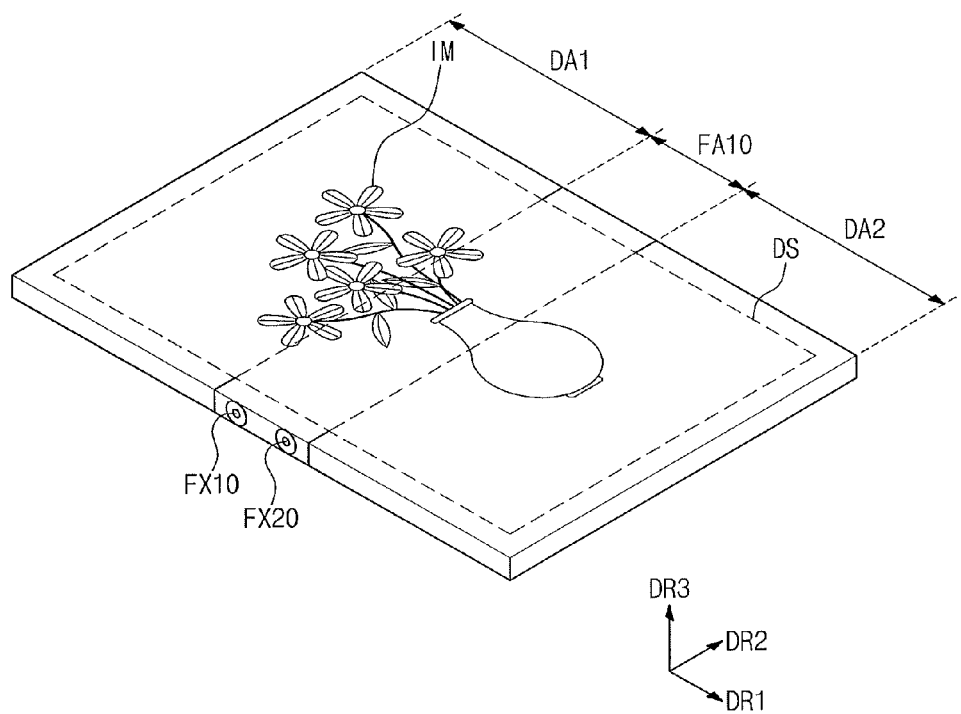
FIG. 5A illustrates another embodiment of a foldable display device.
Figure 5B:
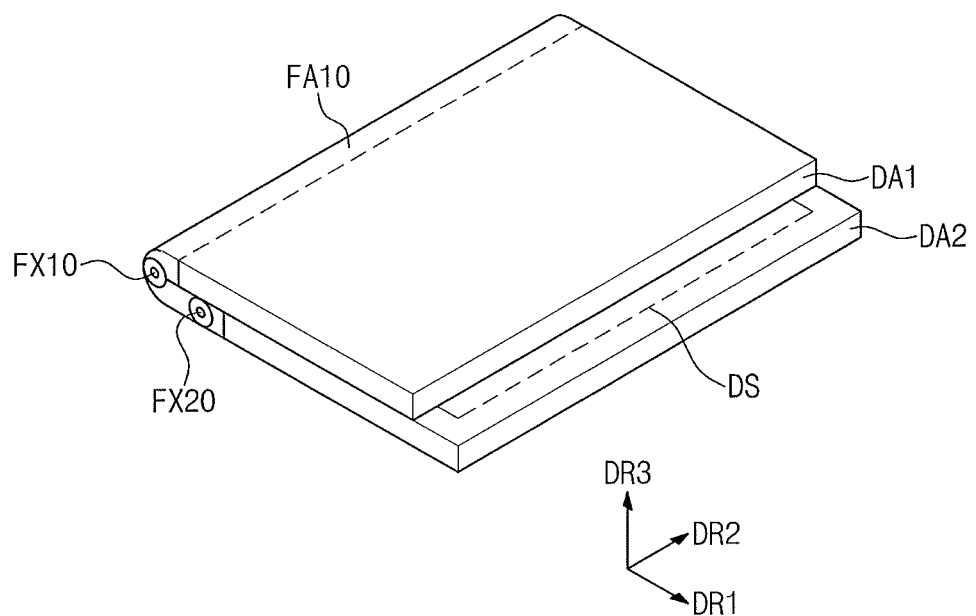
FIG. 5B illustrates the foldable display device in a first folded state.
Figure 5C:
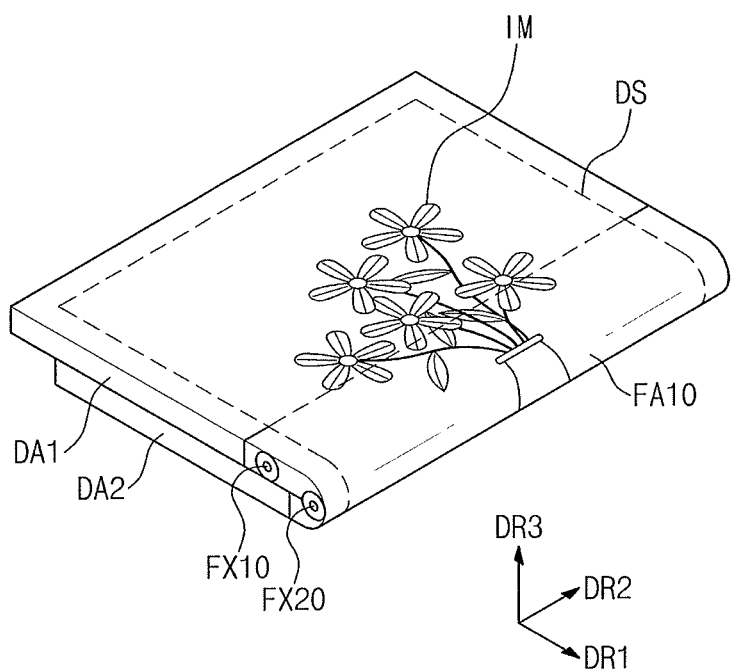
FIG. 5C illustrates the foldable display device in a second folded state.

FIG. 5A illustrates another embodiment of a foldable display device, FIG. 5B illustrates the foldable display device in a first folded state, and FIG. 5C illustrates the foldable display device in a second folded state. In FIGS. 5A-5C, the same reference numerals denote the same elements in FIGS. 1A-4C.

Different from the foldable display devices of previous embodiments, two folding axes FX10 and FX20 are defined in folding area FA10 of the foldable display device in FIGS. 5A-5C. The third folding axis FX3 in FIGS. 1A-1C is omitted in the foldable display device in FIGS. 5A-5C. The folding axes FX10 and FX20 of the folding area FA10 according to the present exemplary embodiment may be applied to at least one of the folding area FA, the first folding area FA1, and the second folding area FA2 in FIGS. 2A-4C.

Referring to FIG. 5B, the foldable display device is inner folded on the basis of the first folding axis FX10. Referring to FIG. 5C, the foldable display device is outer folded on the basis of the second folding axis FX20. The folding axes for the inner and outer foldings of the foldable display device may be changed relative to each other.

The foldable display device may be folded in different directions on the basis of the first and second folding axes FX10 and FX20. The tensile stress and the compressive stress, which are generated when the foldable display device is folded in different directions, are distributed to the first and second folding axes FX10 and FX20. Accordingly, defects of the foldable display device may be reduced or eliminated.

Figure 6A:
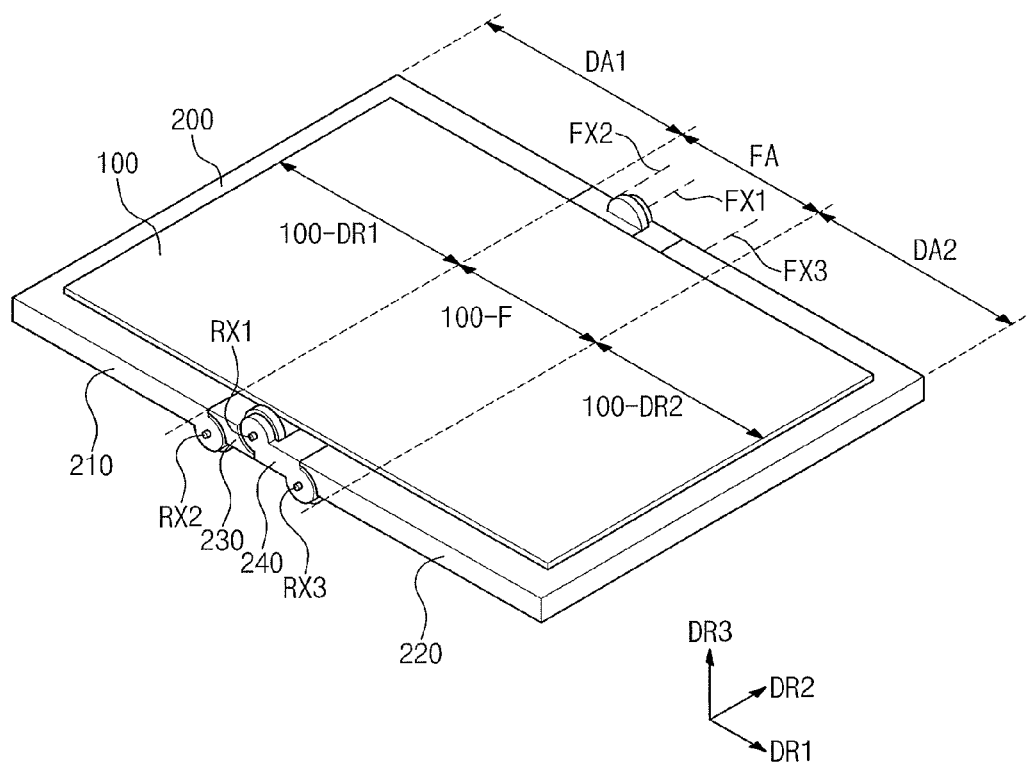
FIG. 6A illustrates another embodiment of a foldable display device.
Figure 6B:
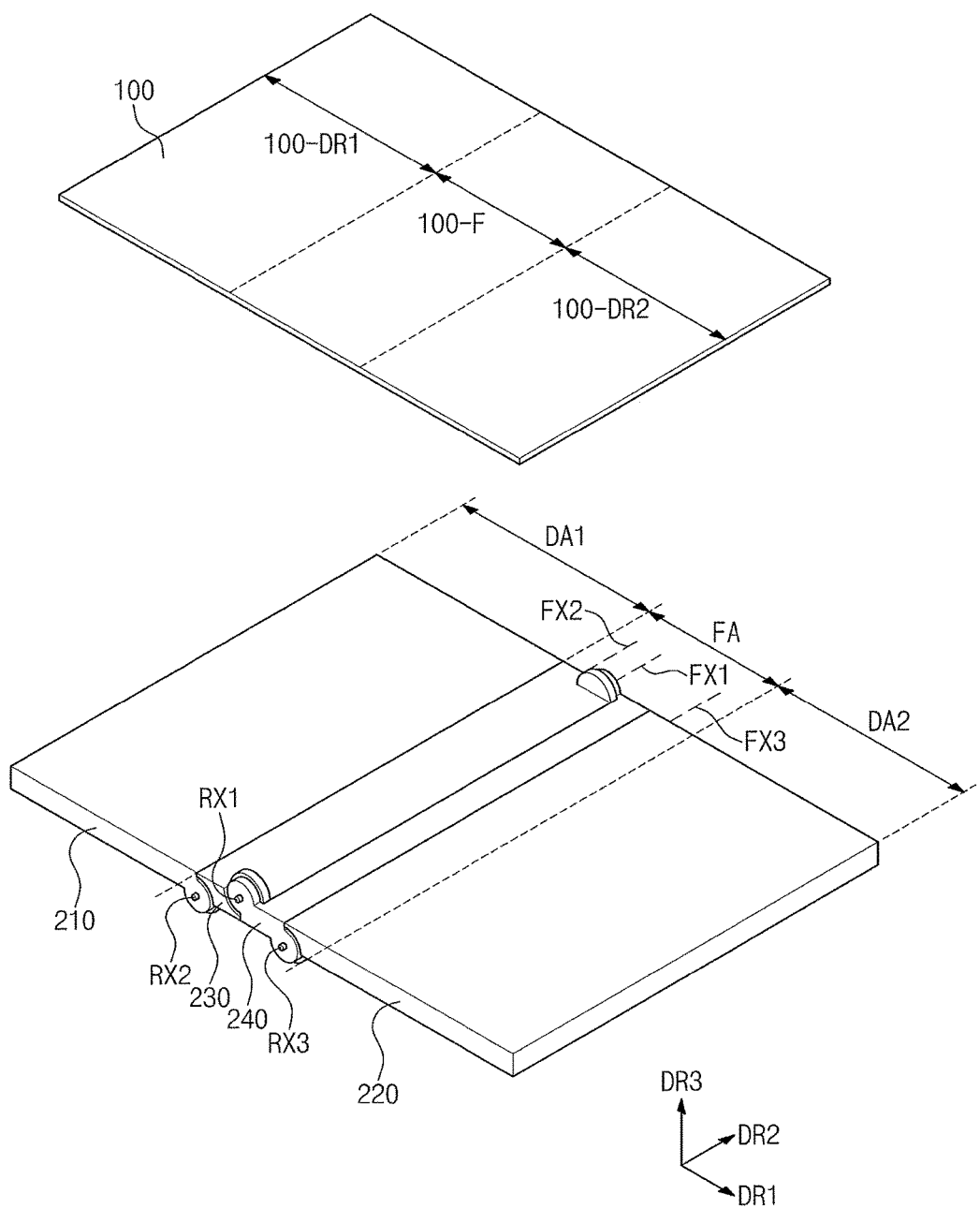
FIG. 6B illustrates another view of the foldable display device.
Figure 6C:
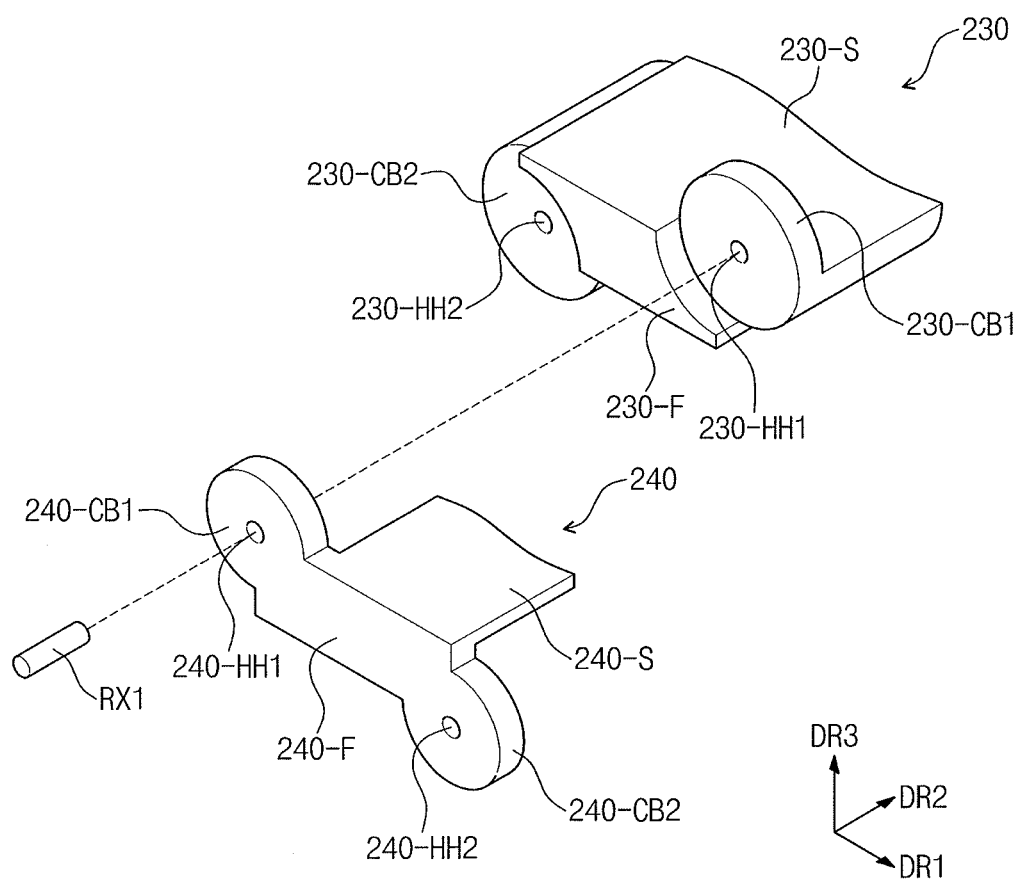
FIG. 6C illustrates an embodiment of a hinge member.
Figure 6D:
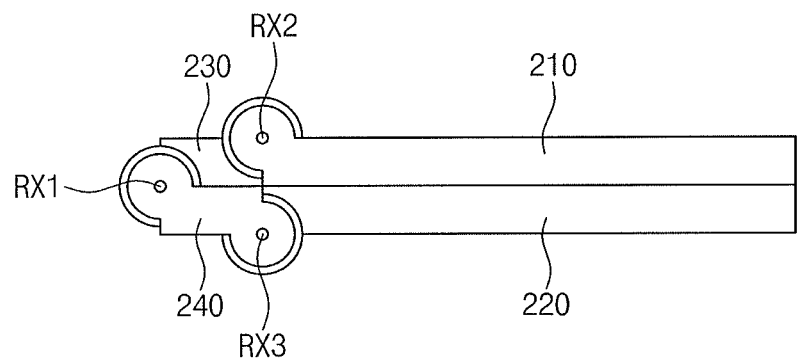
FIG. 6D illustrates the foldable display device in a folded state.
Figure 6E:
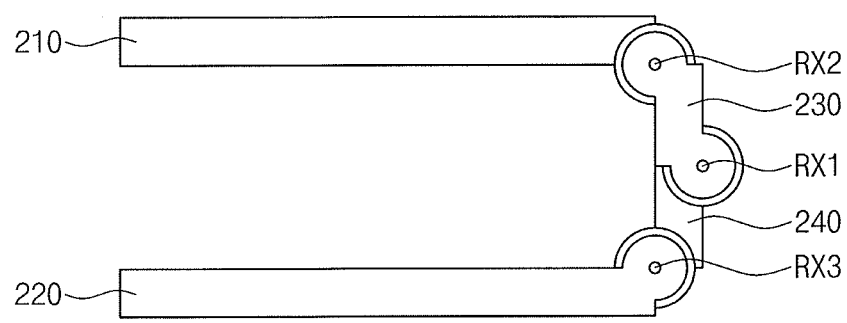
FIG. 6E illustrates the foldable display device in another folded state.

FIG. 6A illustrates another embodiment of a foldable display device, FIG. 6B illustrates another view of the foldable display device, FIG. 6C illustrates an embodiment of a hinge member, FIG. 6D illustrates the foldable display device in a first folded state, and FIG. 6E illustrates the foldable display device in a second folded state. FIGS. 6A-6E show an embodied example of the foldable display device described with reference to FIGS. 1A-1C.

Referring to FIGS. 6A-6C, the foldable display device includes a flexible display module 100 and a housing 200. The display module 100 may be partially or entirely coupled to the housing 200. The coupling structure between the display module 100 and the housing 200 may be different from the one shown. For instance, the housing 200 provides a flat plane surface on which the display module 100 is placed. In the present exemplary embodiment, the housing 200 defines a predetermined space therein and the display module 100 is accommodated in the predetermined space. The housing 200 may define a stepped space therein and the display module 100 may be accommodated in the stepped space.

The display module 100 may be rolled or folded, partially or entirely, at a specific area. The display module 100 includes at least a flexible display panel and various functional members. The display panel may be, for example, an organic light emitting display panel, an electrophoretic display panel, or an electrowetting display panel. The functional members include, for example, a protective member, an optical member, and a touch panel.

The display module 100 includes a first area 100-D1, a second area 100-D2, and a third area 100-F respectively corresponding to the first display area DA1, the second display area DA2, and the folding area FA, which are described with reference to FIGS. 1A to 1C. The first area 100-D1, the second area 100-D2, and the third area 100-F are virtual areas separated from each other by the housing 200.

The housing 200 includes parts coupled to each other. Portions of the parts may be rotatably coupled to each other to form first, second, and third rotational axles RX1, RX2, and RX3. The first, second, and third rotational axles RX1, RX2, and RX3 corresponds to the first, second, and third folding axes FX1, FX2, and FX3, respectively, as described with reference to FIGS. 1A-1C.

The housing 200 includes first, second, third, and fourth body parts 210, 220, 230, and 240. The first body part 210 is disposed to correspond to the first area 100-D1 of the display module 100, and the second body part 220 is disposed to correspond to the second area 100-D2 of the display module 100. The third and fourth body parts 230 and 240 are disposed to correspond to the third area 100-F of the display module 100. Each of the first, second, third, and fourth body parts 210, 220, 230, and 240 is formed, for example, based on an assembly of parts or by an injection molding method. The housing 200 may further include additional body parts to define a plurality of folding areas.

Adjacent ones of the first, second, third, and fourth body parts 210, 220, 230, and 240, body parts are hinge-coupled to each other in this embodiment. For example, the third and fourth body parts 230 and 240 are hinge-coupled to each other. The first and third body parts 210 and 230 are hinge-coupled to each other, and the second and fourth body parts 220 and 240 are hinge-coupled to each other.

A portion in which the third and fourth body parts 230 and 240 are hinge-coupled to each other corresponds to the first rotational axle RX1. A portion in which the first and third body parts 210 and 230 are hinge-coupled to each other corresponds to the second rotational axle RX2. A portion in which the second and fourth body parts 220 and 240 are hinge-coupled to each other corresponds to third rotational axle RX3.

The flexible display module 100 is folded in one direction (e.g., inner direction) on the basis of the first rotational axle RX1 and folded in another direction (e.g. outer direction) opposite to the one direction on the basis of the second and third rotational axles RX2 and RX3. The flexible display module 100 may not be folded in a counter-clockwise direction when being folded in a clockwise direction on the basis of the first rotational axle RX1.

An embodiment of the hinge-coupling portion is described with reference to FIG. 6C, e.g., FIG. 6C illustrates the portion in which the third and fourth body parts 230 and 240 are hinge-coupled to each other. The third and fourth body parts 230 and 240 may be hinge-coupled to each other at two portions spaced apart from each other in the second direction DR2. FIG. 6C shows one portion at which the third and fourth body parts 230 and 240 are hinge-coupled to each other.

The third and fourth body parts 230 and 240 include circular plate portions 230-CB1 and 240-CB1, respectively. The circular plate portions 230-CB1 and 240-CB1 of the third and fourth body parts 230 and 240 include hinge holes 230-HH1 and 240-HH1, respectively. The first rotational axle RX1 is inserted into the hinge holes 230-HH1 and 240-HH1. In the present exemplary embodiment, the first rotational axle RX1 may be integrally formed with the third body part 230 or the fourth body part 240.

The third and fourth body parts 230 and 240 respectively include fixing portions 230-F and 240-F, which contact each other when the third and fourth body parts 230 and 240 are unfolded. Accordingly, the flexible display module 100 may not rotate in the counter-clockwise direction on the basis of the first rotational axle RX1.

The third and fourth body parts 230 and 240 respectively include supporting portions 230-S and 240-S to support the display module 100. The third and fourth body parts 230 and 240 further include circular plate portions 230-CB2 and 240-CB2 respectively hinge-coupled to the first and second body parts 210 and 220. The circular plate portions 230-CB2 and 240-CB2 include hinge holes 230-HH2 and 240-HH2, respectively.

As shown in FIG. 6C, the foldable display device is folded on the basis of the first rotational axle RX1 to allow the first and second body parts 210 and 220 to face each other and to allow the third and fourth body parts 230 and 240 to face each other. The fixing portions of the first and third body parts 210 and 230 contact each other and the fixing portions of the second and fourth body parts 220 and 240 contact each other.

Referring to FIG. 6E, the foldable display device is folded on the basis of the second and third rotational axles RX2 and RX3 so that the first and second body parts 210 and 220 face each other, while being spaced apart from each other by a predetermined distance. The fixing portions of the third and fourth body parts 230 and 240 contact each other.

As shown in FIGS. 6A-6E, when the foldable display device is folded in the clockwise or counter-clockwise direction, the first, second, and third folding axes FX1, FX2, and FX3 are defined by operations of the hinge-coupling portions of the first, second, third, and fourth body parts 210, 220, 230, and 240. Therefore, different from the foldable display device folded in both directions on the basis of one folding axis, the tensile stress and compressive stress, generated when the foldable display device according to the present exemplary embodiment is folded in both directions, are distributed on the basis of the folding axes. Thus, defects of the foldable display device are reduced or eliminated.

In another embodiment, the third rotational axle RX3 may be omitted, and thus the second and fourth body parts 220 and 240 may be integrally formed in a single unitary and individual unit. Accordingly, the foldable display device in FIGS. 5A-5C may be realized.

In another embodiment, another hinge-coupling structure, in which the body parts are rotated only in the clockwise or counter-clockwise direction, may be applied to the foldable display device.

Figure 7:
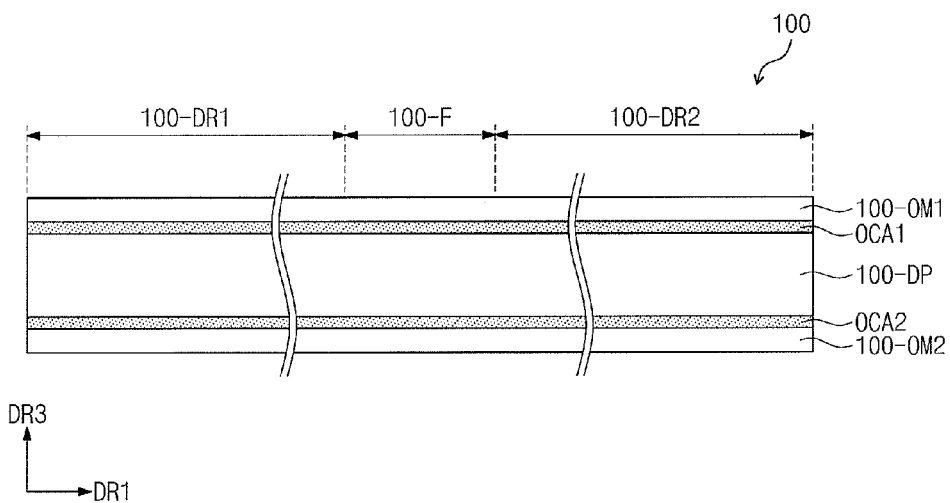
FIG. 7 illustrates an embodiment of a flexible display module.
Figure 8:
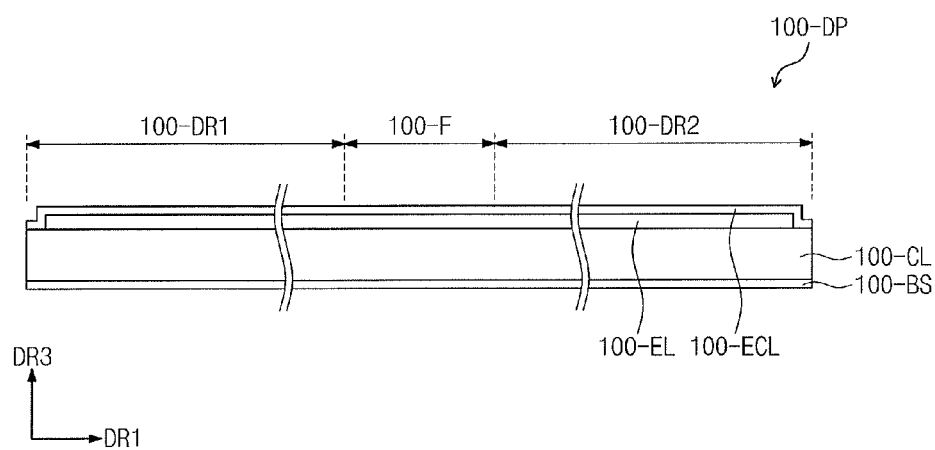
FIG. 8 illustrates an embodiment of a flexible display panel.
Figure 9:
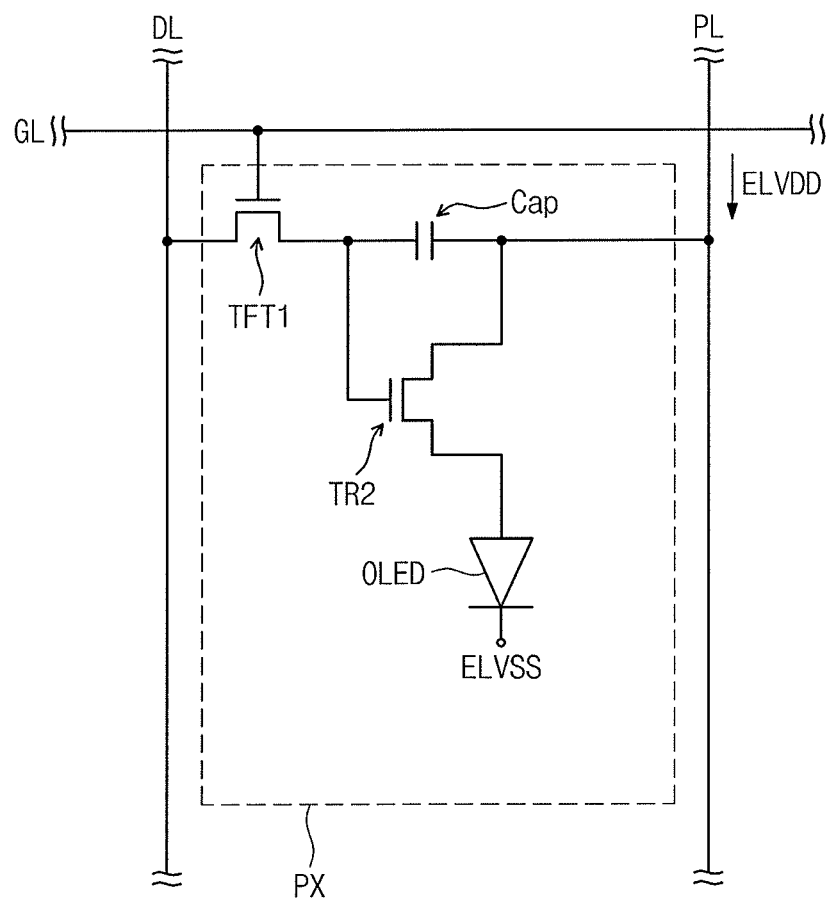
FIG. 9 illustrates an embodiment of a pixel.

FIG. 7 is a cross-sectional view illustrating an embodiment of a flexible display module 100. FIG. 8 is a cross-sectional view showing a flexible display panel according to another embodiment. FIG. 9 is an equivalent circuit diagram illustrating an embodiment of a pixel of a flexible display panel according to one or more of the aforementioned embodiments.

Referring to FIG. 7, the flexible display module 100 includes a display panel 100-DP and first and second outer members 100-OM1 and 100-OM2 coupled to the display panel 100-DP. The display panel 100-DP includes a plurality of pixels for displaying images and a plurality of signal lines connected to the pixels.

The first outer member 100-OM1 is on a display surface of the display panel 100-DP (e.g., a surface on which the image is displayed), and the second outer member 100-OM2 is on a surface of the display panel 100-DP opposite to the display surface. The first outer member 100-OM1 and the display panel 100-DP ma be attached to each other, for example, by a first optically clear adhesive film OCA1. The second outer member 100-OM2 and the display panel 100-DP may be attached to each other, for example, by a second optically clear adhesive film OCA2.

The first outer member 100-OM1 includes a plurality of functional members. The first outer member 100-OM1 includes a polarization plate and a retardation plate, a protective member called a window member, and the touch panel. The second outer member 100-OM2 includes the protective member, which, for example, may include a plastic film. The protective member may further include a functional coating layer, e.g., an anti-fingerprint layer, an anti-glare layer, a hard coating layer, etc.

Referring to FIGS. 8 and 9, the display panel 100-DP may be an organic light emitting display panel or another type of panel. The organic light emitting display panel 100-DP includes a base member 100-BS, a circuit layer 100-CL, a device layer 100-EL, and an encapsulation layer 100-ECL.

As shown in FIG. 8, the base member 100-BS includes at least one plastic film. The base member 100-BS may include two plastic films, and an organic layer, a silicon nitride layer, and/or a silicon oxide layer between the two plastic films. The base member 100-BS includes, for example, polyimide (PI), polyethyleneterephthalate (PET), polyethylenenaphthalate (PEN), polyethersulphone (PES), and fiber reinforced plastic (FRP).

The circuit layer 100-CL includes a plurality of signal lines and electronic devices. In addition, the circuit layer 100-CL includes a plurality of insulating layers to insulate the signal lines from the electronic devices. In the present exemplary embodiment, the signal lines include a gate line, a data line, and a power supply line. The electronic devices include a thin film transistor and a capacitor.

The device layer 100-EL includes light emitting devices. The light emitting devices may include organic light emitting devices OLEDs. The device layer 100-EL may further include elements supporting the organic light emitting devices. The device layer 100-EL may further include insulating layers to insulate or separate each light emitting device from the elements supporting the light emitting device.

The encapsulation layer 100-ECL seals the device layer 100-EL. The encapsulation layer 100-ECL includes one or more inorganic thin layers or one or more organic thin layers and has a structure in which the inorganic thin layers are alternately stacked with the organic thin layers. In the present exemplary embodiment, the encapsulation layer 100-ECL may be replaced, for example, with a glass or film. The encapsulation layer 100-ECL is spaced apart from the base member 100-BS, so that the device layer 100-EL is between the encapsulation layer 100-ECL and the base member 100-BS.

Referring to FIG. 9, the pixel PX includes at least one transistor, at least one capacitor, and an organic light emitting device. A first transistor TFT1 outputs a data signal through a data line DL in response to a gate signal provided through a gate line GL. The capacitor Cap is charged based on a voltage which corresponds to a difference between a voltage corresponding to the data signal from the first transistor TFT1 and a first source voltage ELVDD from a power source line PL.

A second transistor TFT2 controls a driving current flowing through the organic light emitting device OLED in response to an amount of the electric charge stored in the capacitor Cap. A turn-on time of the second transistor TFT2 is determined depending on the amount of the electric charges charged in the capacitor Cap.

The gate line GL, the data line DL, the first transistor TFT1, the second transistor TFT2, and the capacitor Cap are in the circuit layer 100-CL. The organic light emitting device OLED is in the device layer 100-EL in FIG. 8.

Figure 10A:
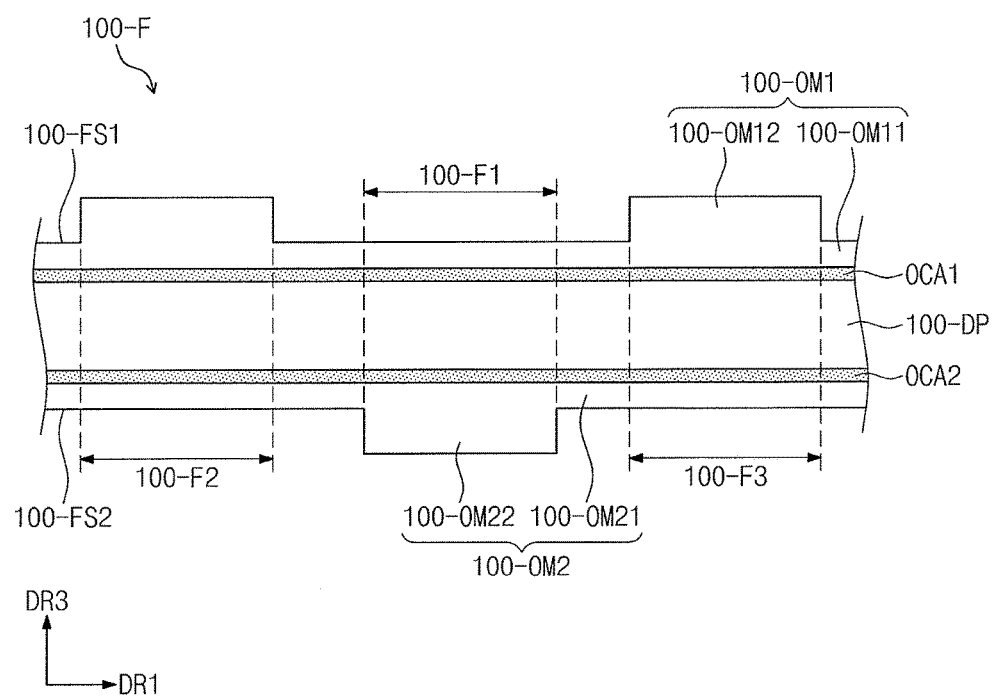
FIG. 10A illustrates an embodiment of a folding area of a flexible display module.
Figure 10B:
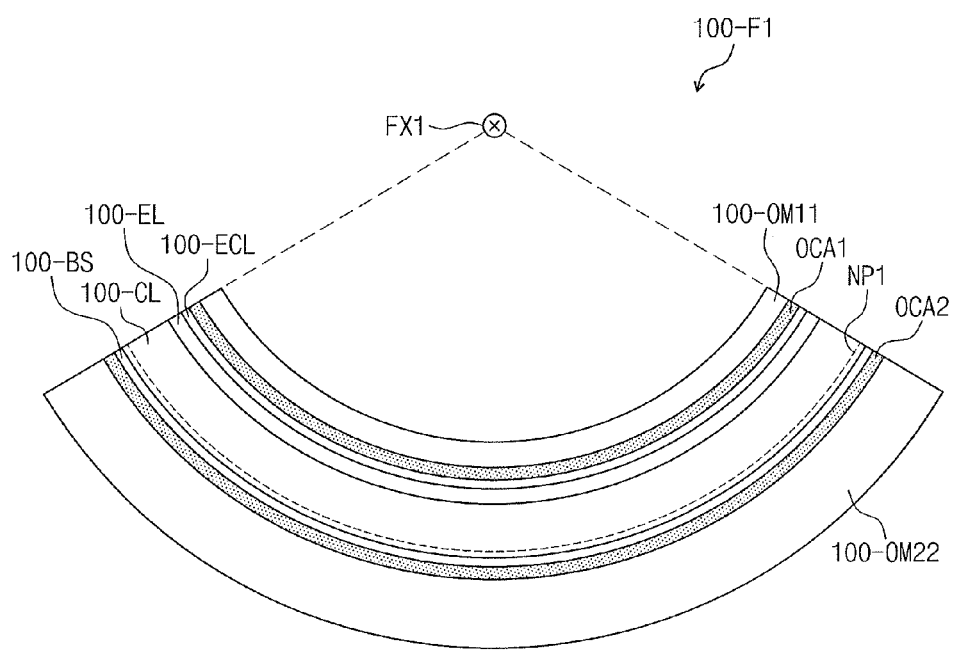
FIG. 10B illustrates an example of stress in a first folding axis area.
Figure 10C:
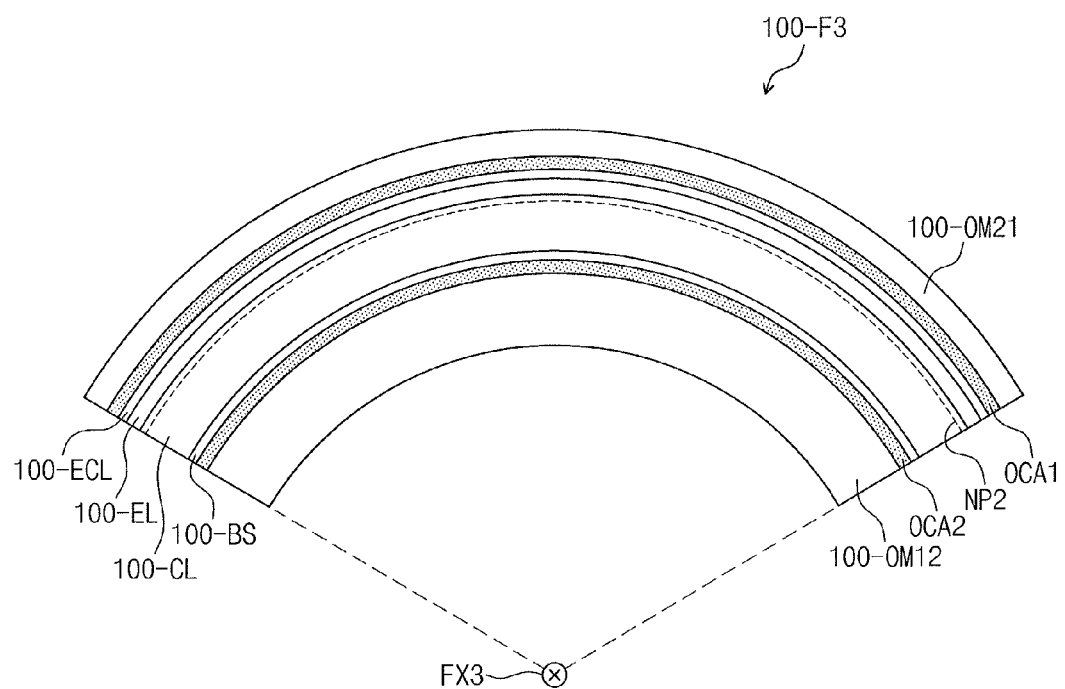
FIG. 10C illustrates an example of stress in a third folding axis area.
Figure 10D:
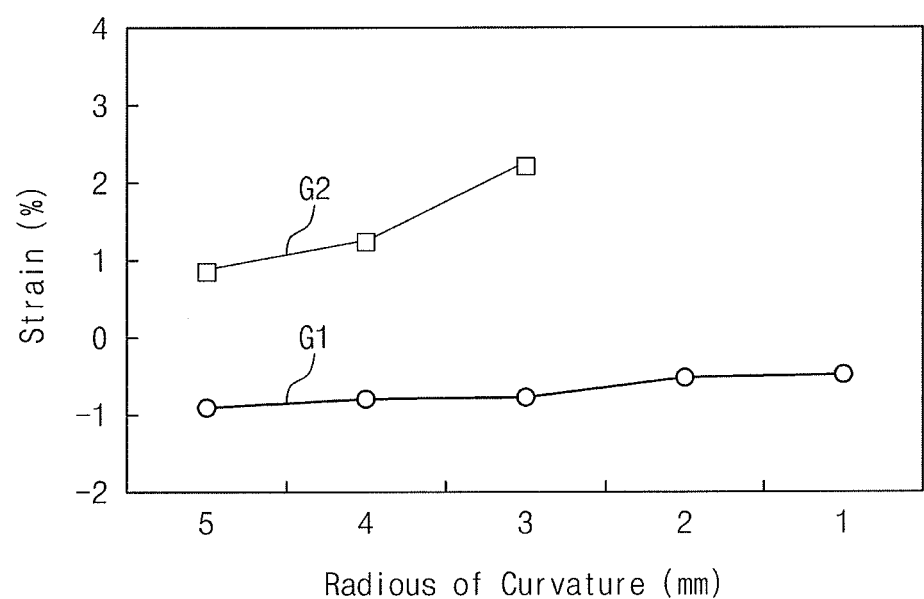
FIG. 10D illustrates an example of strain of a thin film transistor as a function of radius of curvature.

FIG. 10A is an enlarged cross-sectional view illustrating an embodiment of a folding area of a flexible display module. FIG. 10B is a cross-sectional view illustrating an example of stress occurring in a first folding axis area 100-F1 of FIG. 10A. FIG. 10C is a cross-sectional illustrating an example of stress occurring in a third folding axis area 100-F3 of FIG. 10A. FIG. 10D is a graph illustrating an example of strain of a thin film transistor as a function of radius of curvature.

The third area 100-F of the flexible display module 100 in FIG. 10A corresponds to the third area 100-F of the flexible display module 100 in FIG. 6E. The stress occurring in a second folding axis area 100-F2 may substantially the same as that of the third folding axis area 100-F3.

Referring to FIG. 10A, the third area 100-F of the flexible display module 100 includes a first folding axis area 100-F1, a second folding axis area 100-F2, and a third folding axis area 100-F3. The first folding axis area 100-F1 overlaps the first folding axis FX1 (refer to FIG. 6A) and the first rotational axis RX1 (refer to FIG. 6A). The second folding axis area 100-F2 overlaps the second folding axis FX2 (refer to FIG. 6A) and the second rotational axis RX2 (refer to FIG. 6A). The third folding axis area 100-F3 overlaps the third folding axis FX3 (refer to FIG. 6A) and the third rotational axis RX3 (refer to FIG. 6A).

The first outer member 100-OM1 includes a first portion 100-OM11 providing a first flat plane surface 100-FS1 and a second portion 100-OM12 protruding from the first flat plane surface 100-FS1. In one embodiment, a plurality of second portions 100-OM12 may be provided to correspond to the number of folding axes. FIG. 10A shows two second portions 100-OM12 as a representative example.

A step difference may occur between the first and second portions 100-OM11 and 100-OM12 due to at least one of the optical member, the protective member, or the touch panel. The first and second portions 100-OM11 and 100-OM12 are integrally formed in a single unitary and individual unit, or the second portion 100-OM12 may be coupled to on the first portion 100-OM11.

The second outer member 100-OM2 includes a third portion 100-OM21 providing a second flat plane surface 100-FS2 and a fourth portion 100-OM22 protruding from the third flat plane surface 100-FS2. A plurality of fourth portions 100-OM22 may be provided to correspond to the number of folding axes. FIG. 10A shows one fourth portion 100-OM22 as a representative example.

A step difference may occur between the third and fourth portions 100-OM21 and 100-OM22 due to the protective member. The third and fourth portions 100-OM21 and 100-OM22 are integrally formed in a single unitary and individual unit, or the fourth portion 100-OM22 is coupled to on the third portion 100-OM21.

The second portion 100-OM12 of the first outer member 100-OM1 overlaps the second and third folding axis areas 100-F2 and 100-F3. The fourth portion 100-OM22 of the second outer member 100-OM2 overlaps the first folding axis area 100-F 1. The second and fourth portions 100-OM12 and 100-OM22 may have a line shape substantially parallel to the second direction DR2.

Referring to FIG. 10B, when the first folding axis area 100-F1 is inner folded on the basis of the first folding axis FX1, a neutral surface NP1 (e.g., a first neutral surface) is formed in the first folding axis area 100-F1. The first neural surface NP1 is defined adjacent to the base member 100-BS. The first neural surface NP1 is more shifted to the base member 100-BS than other areas by the fourth portion 100-OM22 having a thickness greater than the third portion 100-OM21. Accordingly, the compressive stress is applied to the circuit layer 100-CL.

Referring to FIG. 10C, when the third folding axis area 100-F3 is outer folded on the basis of the third folding axis FX3, a neutral surface NP2 (e.g., a second neutral surface) is formed in the third folding axis area 100-F3. The second neural surface NP2 is defined adjacent to the encapsulation layer 100-ECL. The second neural surface NP2 is more shifted to the encapsulation layer 100-ECL than other areas by the second portion 100-OM12 having a thickness greater than the first portion 100-OM11. Accordingly, the compressive stress is applied to the circuit layer 100-CL.

The circuit layer 100-CL is applied with compressive stress rather than tensile stress regardless of the folding direction. The thin film transistor in the circuit layer has durability against the compressive stress, which is higher than its durability against the tensile stress, when the tensile stress and compressive stress have the same intensity.

FIG. 10D illustrates two simulated graphs G1 and G2 that provide examples in support the above-mentioned durability of the thin film transistor. The first graph G1 represents an example of strain of the thin film transistor applied with compressive stress. The second graph G2 represents an example of strain of the thin film transistor applied with tensile stress. Strain increases as the radius of curvature decreases. In this example, when the flexible display module is folded at the radius of curvature of about 3 mm or more, the thin film transistor is destroyed by the strain caused by the tensile stress. However, the thin film transistor endures the compressive stress generated at a radius of curvature of about 3 mm or more. According to the present exemplary embodiment, the compressive stress is applied to the circuit layer 100-CL of the third area 100-F3 regardless of the folding direction. Thus, the thin film transistor is prevented from being damaged.

Figure 11A:
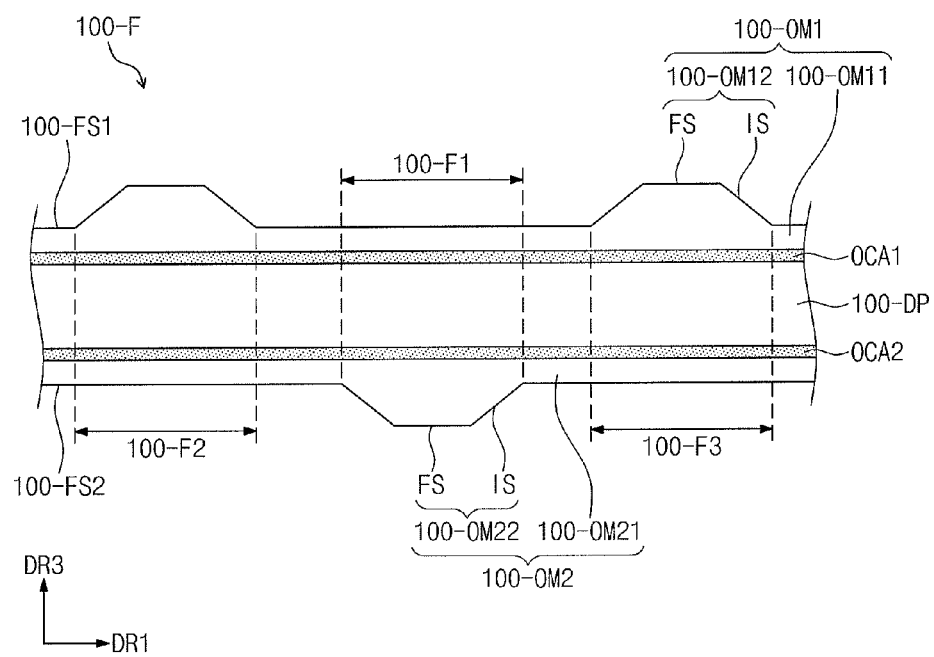
FIG. 11A illustrates an embodiment of a folding area of a flexible display module.
Figure 11B:
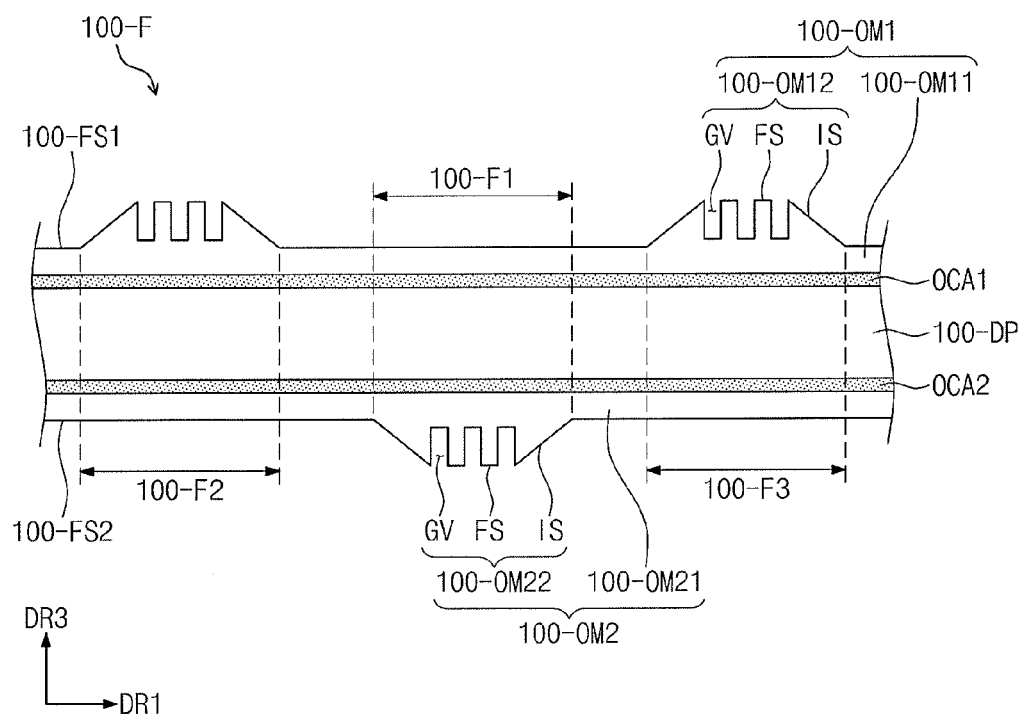
FIG. 11B illustrates another embodiment of a folding area of a flexible display module.

FIGS. 11A and 11B illustrate enlarged cross-sectional views of an embodiment of a folding area of a flexible display module. FIGS. 11A and 11B show the cross-sectional view corresponding to the cross-sectional view in FIG. 10A.

Referring to FIG. 11A, a first outer member 100-OM1 includes a first portion 100-OM11 and a second portion 100-OM12. The second portion 100-OM12 includes a third flat plane surface FS protruding from a first flat plane surface 100-FS1 and an inclination surface IS connecting the first flat plane surface 100-FS1 and the third flat plane surface FS.

A second outer member 100-OM2 includes a third portion 100-OM21 and a fourth portion 100-OM22. The fourth portion 100-OM22 includes a fourth flat plane surface FS protruding from a second flat plane surface 100-FS2 and an inclination surface IS connecting the second flat plane surface 100-FS2 and the fourth flat plane surface FS.

The second and fourth portions 100-OM12 and 100-OM22 have a tapered shape obtained by gradually changing the shape of the first and third portions 100-OM11 and 100-OM21, respectively, when viewed in a cross-sectional view. Thus, boundaries thereof are smooth. Accordingly, the step difference on the first and second outer members 100-OM1 and 100-OM2 may not be recognizable by a user.

Referring to FIG. 11B, each of the second and fourth portions 100-OM12 and 100-OM22 is provided with at least one groove GV defined therein. The groove GV is substantially parallel to the second direction DR2. The groove GV has a stripe shape or includes sub-grooves arranged along the second direction DR2.

The groove GV decreases modulus of the first, second, and third folding axis areas 100-F1, 100-F2, and 100-F3 of the first and second outer members 100-OM1 and 100-OM2. Since the groove GV controls the modulus of the first, second, and third folding axis areas 100-F1, 100-F2, and 100-F3, the first neutral surface NP1 (refer to FIG. 10B) is prevented from being excessively adjacent to the base member 100-BS, and the second neutral surface NP2 is prevented from being excessively adjacent to the encapsulation layer 100-ECL.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A foldable display device that is to fold in both directions, comprising:
   a first display area;
   a second display area; and
   a first folding area between the first display area and the second display area and including first, second, and third folding axes, wherein the first folding axis is between the second and third folding axes and wherein the foldable display device is to fold in one direction of the both directions on the basis of the first folding axis and is to fold in the other direction of the both directions on the basis of the second and third folding axes, wherein the foldable display device includes a flexible display panel and an outer member on a surface of the flexible display panel, and wherein the outer member includes:
   a first portion including a first flat plane surface; and
   a second portion, protruding from the first flat plane surface and overlapping a folding axle of the first, second, and third folding axes, to apply tensile stress to the outer member when the foldable display device is folded.

2. The device as claimed in claim 1, wherein:
   each of the first display area, the second display area, and the first folding area includes a display surface,
   the display surface of the first display area and the display surface of the second display area are to display an image when the foldable display device is outer folded,
   the display surface of the first display area and the display surface of the second display area face outside the foldable display device when the foldable display device is outer folded.

3. The device as claimed in claim 2, wherein:
   the first folding area is inner folded on the basis of the first folding axis to allow the display surface of the first display area to face the display surface of the second display area, or
   the first folding area is outer folded on the basis of the second and third folding axes to allow the display surface of the first display area and the display surface of the second display area to face outside.

4. The device as claimed in claim 2, wherein:
   the first folding area is inner folded on the basis of the second and third folding axes to allow the display surface of the first display area to face the display surface of the second display area, or
   the first folding area is outer folded on the basis of the first folding axis to allow the display surface of the first display area and the display surface of the second display area to face outside.

5. The device as claimed in claim 1, further comprising:
   a third display area; and
   a second folding area between the second and third display areas and including fourth, fifth, and sixth folding axes, wherein the fourth folding axis is between the fifth and sixth folding axes, and the foldable display device is to fold in one direction of the both directions on the basis of the fourth folding axis and to fold in the other direction of the both directions on the basis of the fifth and sixth folding axes.

6. The device as claimed in claim 5, wherein:
   each of the first display area, the second display area, the third display area, the first folding area, and the second folding area includes a display surface, and
   each of the display surface of the first display area, the display surface of the second display area, and the display surface of the third display area are to display an image while exposed outside.

7. The device as claimed in claim 6, wherein:
   the first folding area is inner folded on the basis of the first folding axis to allow the display surface of the first display area to face the display surface of the second display area, and
   the second folding area is inner folded on the basis of the fifth and sixth folding axes to allow the display surface of the third display area to face the display surface of the second display area.

8. The device as claimed in claim 6, wherein:
   the first folding area is inner folded on the basis of the first folding axis to allow the display surface of the first display area to face the display surface of the second display area, and
   the second folding area is outer folded on the basis of the fourth folding axis to allow the display surface of the third display area to face outside.

9. The device as claimed in claim 8, wherein the second folding area exposed outside displays the image.

10. A foldable display device that is to fold in both directions, comprising:
    a first display area;
    a second display area; and
    a folding area between the first display area and the second display area and including first and second folding axes, wherein the foldable display device is to fold in one direction of the both directions on the basis of the first folding axis and is to fold in the other direction of the both directions on the basis of the second folding axis, wherein the foldable display device includes a flexible display panel and an outer member on a surface of the flexible display panel, and wherein the outer member includes:

a first portion including a first flat plane surface; and a second portion, protruding from the first flat plane surface and overlapping a folding axle of the first and second folding axes, to apply tensile stress to the outer member when the foldable display device is folded.

11. A foldable display device that is to fold in both directions, comprising:

a flexible display module; and a housing coupled to the flexible display module and including first, second, and third rotational axles, wherein the first rotational axle is between the second and third rotational axles, the flexible display module is to fold in one direction of the both directions on the basis of the first rotational axle, and the flexible display module is to fold in the other direction of the both directions on the basis of the second and third rotational axles, wherein the flexible display module includes a flexible display panel, a first outer member on a front surface of the flexible display panel, and a second outer member on a rear surface of the flexible display panel, and wherein the first outer member includes a first portion including a first flat plane surface; and a second portion, protruding from the first flat plane surface and overlapping a rotational axle of the first, second, and third rotational axles, to apply tensile stress to the first outer member when the flexible display module is folded.

12. The device as claimed in claim 11, wherein the housing includes:

a first body part;

a second body part;

a third body part hinge-coupled to the first body part; and a fourth body part hinge-coupled to the second and third body parts, wherein a portion at which the first body part is hinge-coupled to the third body part corresponds to the second rotational axle, a portion at which the second body part is hinge-coupled to the fourth body part corresponds to the third rotational axle, and a portion at which the third body part is hinge-coupled to the fourth body part corresponds to the first rotational axle.

13. The device as claimed in claim 11, wherein the flexible display module includes:

a first area corresponding to the first body part, a second area corresponding to the second body part, a third area corresponding to the third and fourth body parts, and a display surface of the first area and a display surface of the second area to display an image when the flexible display module is outer folded to allow the display surface of the first area and the display surface of the second area to face an outside of the flexible display module.

14. The device as claimed in claim 13, wherein:

the display surface of the first area and the display surface of the second area are inner folded on the basis of the first rotational axle to face each other, and the display surface of the first area and the display surface of the second area are outer folded on the basis of the second and third rotational axles to allow the display surface of the first area and the display surface of the second area to face outside.

15. The device as claimed in claim 13, wherein:

the display surface of the first area and the display surface of the second area are inner folded on the basis of the second and third rotational axles to face each other, and the display surface of the first area and the display surface of the second area are outer folded on the basis of the first rotational axle to allow the display surface of the first area and the display surface of the second area to face outside.

16. The device as claimed in claim 11, wherein the second outer member includes:

a third portion including a second flat plane surface; and a fourth portion protruding from the second flat plane surface and overlapping a rotational axle of the first, second, and third rotational axles, to apply tensile stress to the second outer member when the flexible display module is folded.

17. The device as claimed in claim 11, wherein the second portion includes:

a second flat plane surface protruding from the first flat plane surface; and an inclination surface connecting the first flat plane surface and the second flat plane surface.

18. The device as claimed in claim 11, further comprising:

a plurality of grooves in the second portion and substantially parallel to the first, second, and third rotational axes.

* * * * *